(12) United States Patent
Smith

(10) Patent No.: US 6,445,631 B2
(45) Date of Patent: Sep. 3, 2002

(54) NON-VOLATILE LATCH WITH PROGRAM STRENGTH VERIFICATION

(75) Inventor: Gregory J. Smith, Tucson, AZ (US)

(73) Assignee: National Semiconductor Corporation, Santa Clara, CA (US)

(*) Notice: Subject to any disclaimer, the term of this patent is extended or adjusted under 35 U.S.C. 154(b) by 123 days.

(21) Appl. No.: 09/938,397

(22) Filed: Aug. 23, 2001

Related U.S. Application Data

(62) Division of application No. 09/627,530, filed on Jul. 28, 2000, now Pat. No. 6,307,773.

(51) Int. Cl.$^7$ .................................................. G11C 7/00
(52) U.S. Cl. .................. 365/201; 365/200; 365/185.01
(58) Field of Search ................................. 365/201, 200, 365/185.01, 189.05, 230.08, 154

(56) References Cited

U.S. PATENT DOCUMENTS

| | | |
|---|---|---|
| 4,342,101 A | 7/1982 | Edwards |
| 5,566,110 A | 10/1996 | Soenen et al. |
| 5,587,603 A | 12/1996 | Kowshik |
| 5,892,712 A | 4/1999 | Hirose et al. |
| 5,943,268 A | 8/1999 | Nguyen |
| 5,986,932 A | 11/1999 | Ratnakumar et al. |
| 6,252,809 B1 * | 6/2001 | Kim ........................... 365/200 |

OTHER PUBLICATIONS

"LM4130 Precision micropower Low Dropout Voltage Reference," Data Sheet, National Semiconductor Corporation, Nov. 1999.

Kolodny et al., "Analysis and Modeling of Floating–Gate EEPROM Cells," IEEE Trans. Electron Devices, vol. ED–33, No. 6, Jun. 1986.

Oto et al., "High–Voltage Regulation and Process Considerations for High–Density 5 V–Only E$^2$PROM's," IEEE Journal of Solid–State Circuits, vol. SC–18, No. 5, Oct. 1983.

* cited by examiner

Primary Examiner—Daivd Nelms
Assistant Examiner—David Lam
(74) Attorney, Agent, or Firm—Beyer Weaver & Thomas, LLP

(57) ABSTRACT

An improved approach to examining program strength of non-volatile latches is disclosed. The program strength is able to be evaluated by inferring floating gate charge of memory elements of the non-volatile latches as indicated by current characteristics of the memory elements. Access to the program charge or the internal currents is facilitated by monitoring circuitry provided integral with the non-volatile latches.

12 Claims, 5 Drawing Sheets

US 6,445,631 B2

NON-VOLATILE LATCH WITH PROGRAM STRENGTH VERIFICATION

This is a Divisional application of prior application No. 09/627,530 filed on July 28, 2000, now U.S. Pat. No. 6,307,773.

BACKGROUND OF THE INVENTION

1. Field of the Invention

The present invention relates to memory devices and, more particularly, to non-volatile latches that operate as memory devices.

2. Description of the Related Art

Semiconductor memories are well known and can be classified as either volatile or non-volatile memory. Volatile memory loses stored information (data) once power is removed, while non-volatile memory retains its stored information even after power is removed.

One common type of semiconductor memory that is non-volatile is known as a non-volatile latch. A single non-volatile latch provides information storage for one-bit of data through use of a pair of cross-coupled drive transistors which each have a load. The load for each of the drive transistors is typically a transistor but can also be a non-active device such as a resistor. Non-volatile latches also provide a continuous status output signal and thus do not require read amplifiers or refresh operations.

FIG. 1 is a schematic diagram of a conventional non-volatile latch circuit 100. The non-volatile latch circuit 100 is a complementary metal-oxide-semiconductor (CMOS) circuit having n-type metal-oxide-semiconductor (NMOS) devices and p-type metal-oxide-semiconductor (PMOS) devices. The non-volatile memory circuit 100 includes a first floating-gate NMOS transistor 101 and a second floating-gate NMOS transistor 102. The NMOS transistor 101 and the second NMOS transistor 102 each operate as a memory cell. The non-volatile memory circuit 100 also includes a first PMOS transistor 104 and a second PMOS transistor 106. The first PMOS transistor 104 serves as a load for the first floating-gate NMOS transistor 101, and the second PMOS transistor 106 serves as a load for the second floating-gate NMOS transistor 102. Additionally, the non-volatile latch circuit 100 may also include an inverter 108 to buffer the data stored in the non-volatile latch and thus provide a voltage output ($V_{OUT}$) for the memory bit.

Conventional non-volatile latches are programmed to store data and then retain the data until subsequently reprogrammed or cleared. Unfortunately, however, when programming is weak or leakage currents are present, non-volatile latches are significantly more likely to fail and thus lose the stored data. Although the programming of stored data can be verified after programming in a digital sense (i.e., "0" or "1"), conventionally there exists no way to conveniently examine program strength (e.g., program charge) of non-volatile latches. As a result, non-volatile latches with weak programming or significant leakage currents are normally not identified and thus used without knowledge of being susceptive to failure.

Thus, there is a need for improved approaches to examining program strength of non-volatile latches.

SUMMARY OF THE INVENTION

Broadly speaking, the invention relates to an improved approach to examining program strength of non-volatile latches. The program strength is able to be evaluated by inferring floating gate charge of memory elements of the non-volatile latches as indicated by current characteristics of the memory elements. Access to the memory elements current characteristics is facilitated by monitoring circuitry provided integral with the non-volatile latches.

The invention can be implemented in numerous ways including as a method, a system, and a device. Several embodiments of the invention are discussed below.

As a non-volatile memory circuit, one embodiment of the invention includes at least: a non-volatile memory cell capable of being programmed into a programmed state; a monitoring circuit operatively connected to the non-volatile memory cell, the monitoring circuit being configured to measure strength of the programming of the non-volatile memory cell in the programmed state; and a buffer configured to output an output signal in accordance with the programmed state of the non-volatile memory cell.

As a non-volatile memory circuit, another embodiment of the invention includes at least: a non-volatile memory cell capable of being programmed into a programmed state; means for measuring strength of the programming of the non-volatile memory cell in the programmed state; and a buffer configured to output an output signal in accordance with the programmed state of the non-volatile memory cell.

As a non-volatile memory circuit, still another embodiment of the invention includes at least: a first floating gate transistor having a drain terminal, a source terminal, a control gate terminal, and a charge injection terminal, the drain terminal being coupled to a first node, the source terminal being coupled to a first potential, the gate terminal being coupled to a first set potential, and the charge injection terminal being coupled to a second set potential; a second floating gate transistor having a drain terminal, a source terminal, a control gate terminal, and a charge injection terminal, the drain terminal being coupled to a second node, the source terminal being coupled to the first potential, the gate terminal being coupled to the second set potential, the charge injection terminal being coupled to the first set potential; a first latch transistor having a drain terminal, a source terminal and a gate terminal, the drain terminal being coupled to the first node, the source terminal being coupled to a second potential, and the gate terminal being coupled to the second node; a second latch transistor having a drain terminal, a source terminal and a gate terminal, the drain terminal being coupled to the first node, the source terminal being coupled to the second potential, and the gate terminal being coupled to the first node; a first test transistor having a drain terminal, a source terminal and a gate terminal, the drain terminal being coupled to the first node, the source terminal being coupled to a first test line, and the gate terminal being coupled to a second test line; a second test transistor having a drain terminal, a source terminal and a gate terminal, the drain terminal being coupled to the second node, the source terminal being coupled to the first test line, and the gate terminal being coupled to a third test line; and an output buffer coupled to the second node for providing an output of the non-volatile memory circuit.

As a method for examining program strength of a previously programmed non-volatile memory latch provided within an integrated circuit, one embodiment of the invention includes the acts of: setting external test control signals that provide electrical connection to the non-volatile memory latch; and determining a programming strength for the non-volatile memory latch via the electrical connection provided to the non-volatile memory latch.

As an integrated circuit, one embodiment of the invention includes at least: a first non-volatile latch providing a pair of first memory cells that together provide a first bit of memory; a first pair of test selectors respectively controllably coupled to the pair of the first memory cells; a second non-volatile latch providing a pair of second memory cells that together provide a second bit of memory; a second pair of test selectors respectively controllably coupled to the pair of the second memory cells; a third non-volatile latch providing a pair of third memory cells that together provide a third bit of memory; a third pair of test selectors respectively controllably coupled to the pair of the first memory cells; a first test line operatively connected to the first pair of test transistors; a second test line operatively connected to one of the test selectors of the first pair of transistors; and a third test line operatively connected to another of the test selectors of the first pair of transistors.

The advantages of the invention are numerous. Different embodiments or implementations may yield one or more of the following advantages: One advantage of the invention is that programming margin can be conveniently examined. Another advantage of the invention is that program strength can be determined based on a quantitative examination of program charge. Yet another advantage of the invention is that reliability or failure testing of non-volatile latches is facilitated. Such testing can, for example, allow for rejection of defective non-volatile latches, determining end of programming life or program strength over time, or determining need for refresh programming. Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF THE INVENTION

The invention pertains to an improved approach to examining program strength of non-volatile latches. The program strength is able to be evaluated by monitoring program charge or internal currents associated with memory cells within non-volatile latches. Access to the program charge or the internal currents is facilitated by monitoring circuitry provided integral with the non-volatile latches.

Embodiments of this aspect of the invention are discussed below with reference to FIGS. 2-5. However, those skilled in the art will readily appreciate that the detailed description given herein with respect to these figures is for explanatory purposes as the invention extends beyond these limited embodiments.

Figure 1:
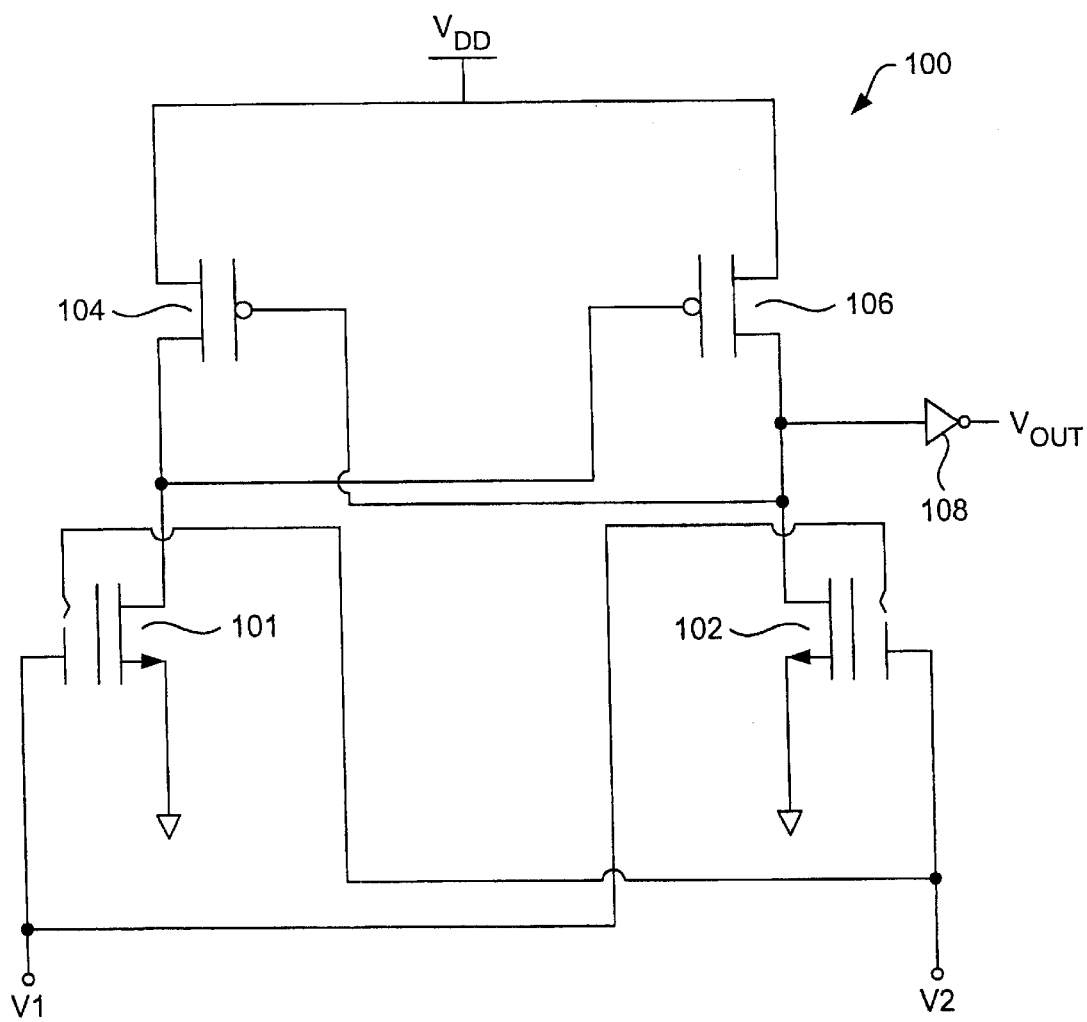
FIG. 1 is a schematic diagram of a conventional non-volatile latch circuit.
Figure 2:
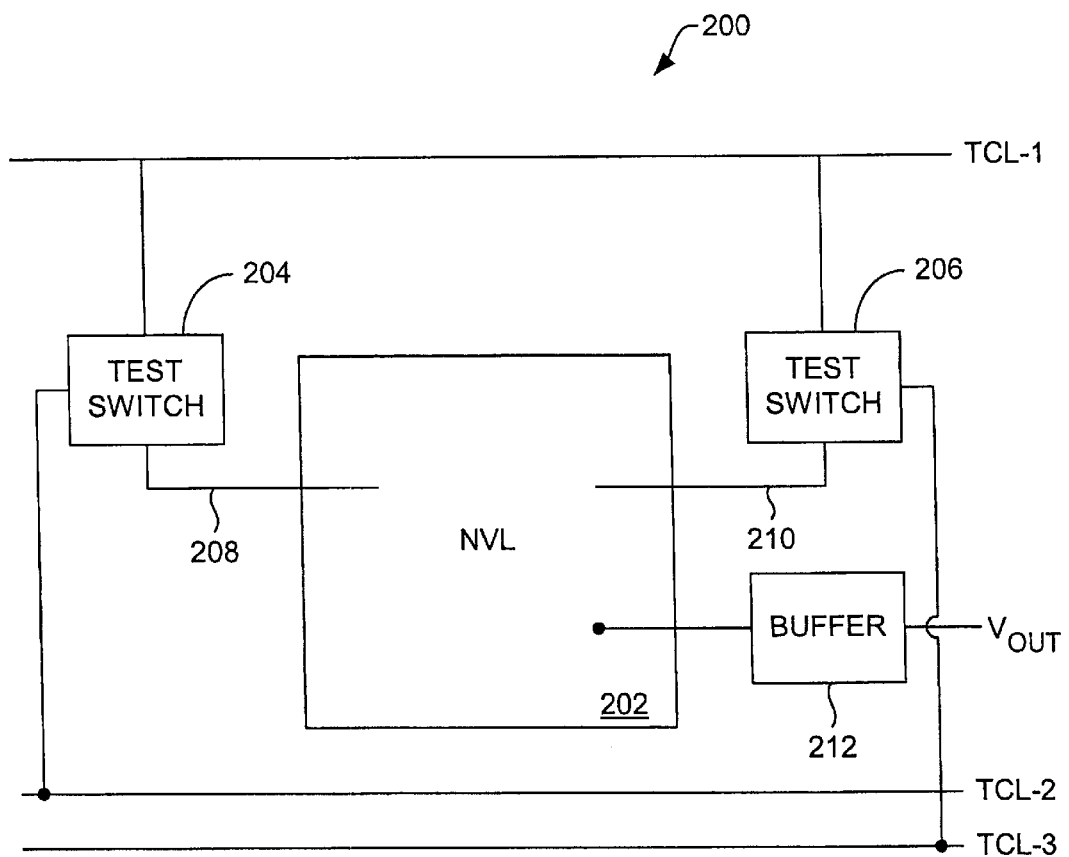
FIG. 2 is a block diagram of a non-volatile memory circuit according to a basic embodiment of the invention.

FIG. 2 is a block diagram of a non-volatile memory circuit 200 according to a basic embodiment of the invention. The non-volatile memory circuit 200 includes a non-volatile latch (NVL) 202. The non-volatile latch 202 provides storage of one bit of data, i.e., one-bit memory. The one-bit memory is made non-volatile by a latch mechanism. The one-bit memory is also referred to as a memory component.

The non-volatile memory circuit 200 also includes a first test switch 204 and a second test switch 206. The first test switch 204 electrically connects a first test control line (TCL-1) with a link 208 that couples to a first internal portion of the non-volatile latch 202. The second test switch 206 electrically connects the first test control line (TCL-1) with a line 210 that couples to a second internal portion of the non-volatile latch 202. The test switches 204 and 206 are respectively activated in accordance with a second test control line (TCL-2) and a third test control line (TCL-3). Moreover, the non-volatile memory circuit 200 includes a buffer 212 that serves to amplify a value stored in the bit memory for output as output voltage ($V_{OUT}$).

The non-volatile memory circuit 200 is able to utilize the first and second test switches 204 and 206 to access the first or second internal portions of the non-volatile latch 202 so that program strength of the memory component associated with the non-volatile latch 202 can be monitored. The monitoring of the program strength of the non-volatile latch 202 allows for the determination of whether the programming of the non-volatile latch 202 has sufficient programming margin. With a sufficiently large programming margin (i.e., sufficiently strong program strength), the data programmed into the memory component is likely to be reliable.

The non-volatile latch 202 can not only be evaluated for data-retention problems immediately following programming but also subsequently during the life of the non-volatile memory circuit 200. For example, if the non-volatile latch 202 were poorly programmed initially and also suffering from a loss (leakage) of program charge, then problems could subsequently occur. Namely, the loss of charge would eventually cause a reversal of the program state of the non-volatile latch 202. Further, even if adequately initially programmed with an adequate programming margin, a loss (leakage) of program charge could also lead to a reversal of the program state of the non-volatile latch 202. Of course, a loss of the program state represents a loss of the data stored in the non-volatile latch 202.

Figure 3:
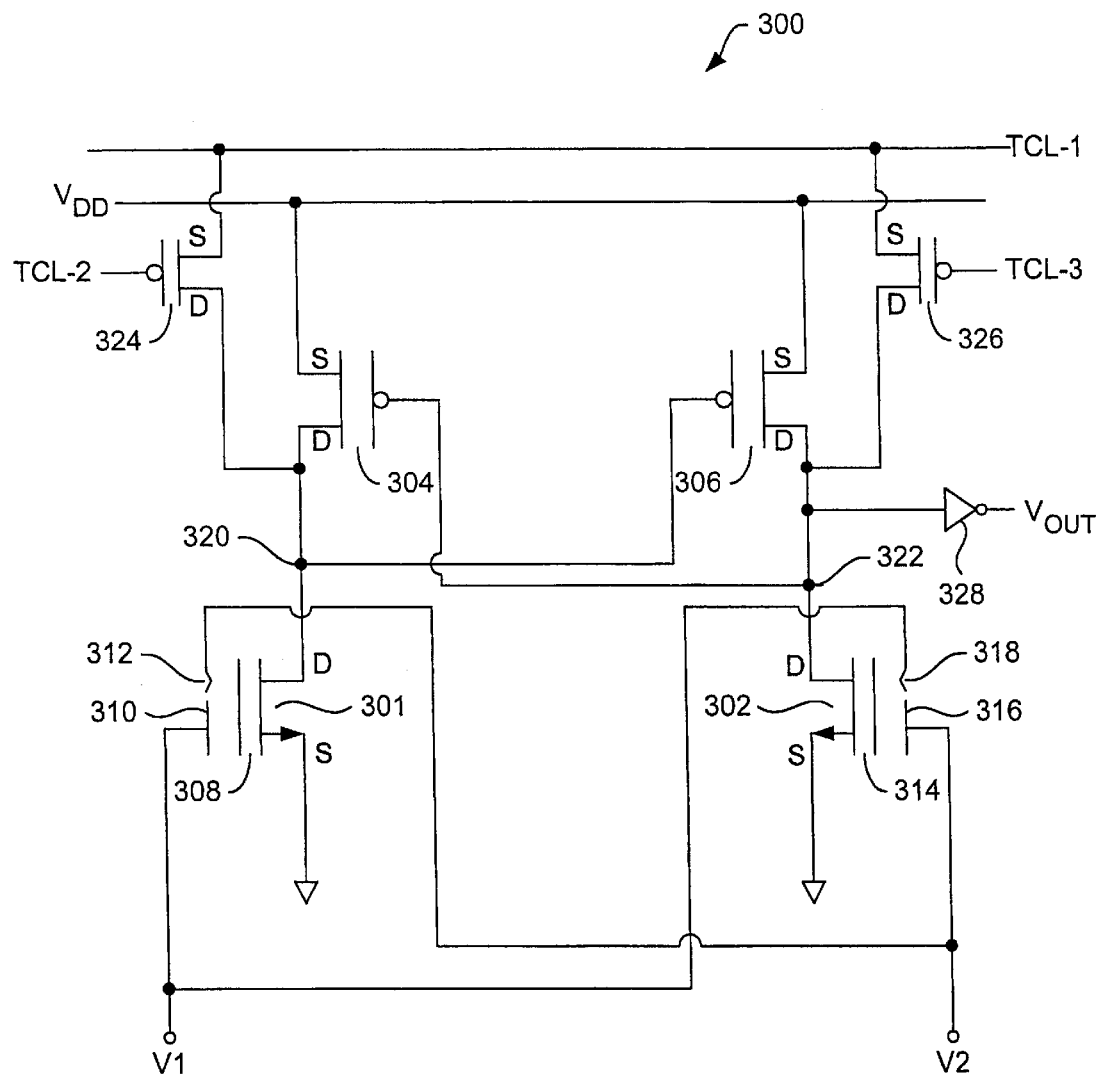
FIG. 3 is a schematic diagram of a non-volatile memory circuit according to one embodiment of the invention.

FIG. 3 is a schematic diagram of a non-volatile memory circuit 300 according to one embodiment of the invention. The non-volatile memory circuit 300 is, for example, a more detailed embodiment of the non-volatile memory circuit 200 illustrated in FIG. 2. In one embodiment, the non-volatile memory circuit 300 is an Electrically Erasable Programmable Read-Only Memory (EEPROM).

The non-volatile memory circuit 300 is a complementary metal-oxide-semiconductor (CMOS) circuit having n-type metal-oxide-semiconductor (NMOS) devices and p-type metal-oxide-semiconductor (PMOS) devices. The non-volatile memory circuit 300 includes a first NMOS transistor 301 and a second NMOS transistor 302. The first NMOS transistor 301 and the second NMOS transistor 302 each operates as memory cells that cooperate to provide a single bit of data storage (memory bit). The first and second NMOS transistors 301 and 302 can also be referred to as EEPROM memory transistors. The non-volatile memory circuit 300 also includes a first PMOS transistor 304 and a second PMOS transistor 306. The first PMOS transistor 304 serves as a load for the NMOS transistor 301, and the second PMOS transistor 306 serves as a load for the NMOS transistor 302. The first and the second PMOS transistors 304 and 306 together form a half-latch and serve to latch the memory bit such that it is driven to either a logical high ("1") or a logical low state ("0")..

The NMOS transistor 301 includes a source, a drain, a floating gate 308, a control gate 310, and a charge injection 312. The second NMOS transistor 302 includes a source, a drain, a floating gate 314, a control gate 316, and a charge injection 318. The control gate 310 of the first NMOS transistor 301 is coupled to a first voltage level (V1), and the control gate 316 of the second NMOS transistor 302 is coupled to a second voltage level (V2). The charge injection 312 of the first NMOS transistor 301 is coupled to the second voltage level (V2), and the second charge injection 318 of the second NMOS transistor 302 is coupled to a first voltage level (V1). The source of the first NMOS transistor 301 is coupled to ground, and the source of the second NMOS transistor 302 is coupled to ground. The drain of the first NMOS transistor 301 is coupled to a first node 320. The drain of the second NMOS transistor 302 is coupled to a second node 322.

The first PMOS transistor 304 has a source, a drain, and a gate. The source is coupled to a power supply ($V_{DD}$), the drain is coupled to the first node 320, and the gate is coupled to the second node 322. The second PMOS transistor 306 includes a source, a drain, and a gate. The source is coupled to the power supply ($V_{DD}$), the drain is coupled to the second node 322, and the gate is coupled to the first node 320.

Additionally, the non-volatile memory circuit 300 includes a first test PMOS transistor 324, a second test PMOS transistor 326, and an inverter 328. The first PMOS transistor 324 includes a source, a drain, and a gate. The source is coupled to a first test control line (TCL-1), the drain is coupled to the first node 320 (i.e., the drain of the first NMOS transistor 301), and the gate is coupled to a second test control line (TCL-2). The second test PMOS transistor 326 includes a source, a drain, and a gate. The source is coupled to the first test control line (TCL-1), the drain is coupled to the second node 322 (i.e., the drain of the second NMOS transistor 302), and the gate is coupled to a third test control line (TCL-3). The inverter 328 amplifies, buffers and inverts the data stored in the non-volatile latch 202 and thus provides a voltage output ($V_{OUT}$) for the memory bit.

The non-volatile memory circuit 300 generally operates as follows. The first and second test PMOS transistors 324 and 326 are normally biased and an "off" condition. However, during testing (test mode), the first and second test PMOS transistors 324 and 326 are selectively switched to an "on" condition so that the drain-to-source-shorted ($I_{DSS}$) of the corresponding first and second NMOS transistors 301 and 302 can be measured. During the test mode, the first test control line (TCL-1) is biased to a voltage that allows the drain-to-source-shorted ($I_{DSS}$) can be measured. The biasing of the first test control line (TCL-1) during the test mode is typically to a voltage greater than the power supply voltage ($V_{DD}$) to prevent potential conduction in the half-latch devices. The first and second PMOS transistors 304 and 306 (load transistors) have a sufficient channel width to pass the respective drain-to-source-shorted ($I_{DSS}$) current without saturating, even at their lowest level of applied gate-to-source voltage (Vgs).

During programming of the first and second NMOS transistors 301 and 302, one of the first and voltage levels (V1 or V2) is pulled to ground and the other of the voltage levels is driven to a high voltage (e.g., 15V). Such applied voltages induce charged transfer on each of the floating gates 308 and 314 respectively associated with the first and second NMOS transistors 301 and 302. Following programming, the first and second voltage levels (V1 and V2) are pulled to ground and one of the first and second NMOS transistors 301 and 302 has a threshold voltage level that has significantly increased from its initial threshold voltage level prior to programming, and the other of the first and second NMOS transistors 301 and 302 has a threshold voltage level that is significantly reduced from its prior threshold voltage level before programming. These programmed first and second NMOS transistors 301 and 302 can thus respectively be referred to as a high enhancement mode device and a depletion mode device, respectively. In one embodiment, with the first and second voltage levels (V1 and V2) pulled to ground, the depletion mode device would have a drain-to-source-shorted current ($I_{DSS}$) on the order of 50-500 µA for drain voltages greater than several hundred millivolts (mV). The enhancement mode device would have a drain-to-source-shorted current ($I_{DSS}$) that is very low, i.e., on the order of pico or nano Amperes.

After programming, both of the first and second NMOS transistors 301 and 302 has its control gate 310 or 316 coupled to ground. With the depletion NMOS transistor biased "on" (conductive) the drain voltage will decrease to near ground. This low drain voltage would turn "on" the PMOS transistor having it gate driven by the depletion NMOS transistor by forcing the gate-to-source voltage (Vgs) of such PMOS transistor to near the power supply voltage ($V_{DD}$). Accordingly, this PMOS transistor would now be able to oppose the current of the other NMOS transistor that is high enhancement. The PMOS transistor driven "on" and the NMOS transistor that is "off" share a common drain which pulls high and thus drives the other PMOS transistor off. At this point, there are no opposing currents and the non-volatile latch is latched in a stable program state. If the half-latch were to change state, it would require that the depletion NMOS transistor have a pull down current at its drain that exceeds the maximum sourcing current of the common drain PMOS transistor that occurs when its gate-to-source voltage (Vgs) equals the maximum power supply voltage ($V_{DD}$) The non-volatile latch is designed such that the minimum programmed depletion mode device (transistor 301 or 302) drain current will always exceed the maximum drain current of a fully conducting load transistor (transistor 304 or 306). The PMOS transistors 304 or 306 maximum drain current occurs when the power supply voltage ($V_{DD}$) is at its maximum value. The drain current magnitude can be adjusted by changing the width/length of the PMOS transistors 304 or 306 channel region.

The range of the drain currents of the first and second PMOS transistors should be centered between the drain-to-source-shorted ($I_{DSS}$) of the enhancement mode device and the depletion mode device. The PMOS drain current should also be adjusted high enough so as to not be overcome by any unanticipated leakage currents at their drain nodes.

Figure 4:
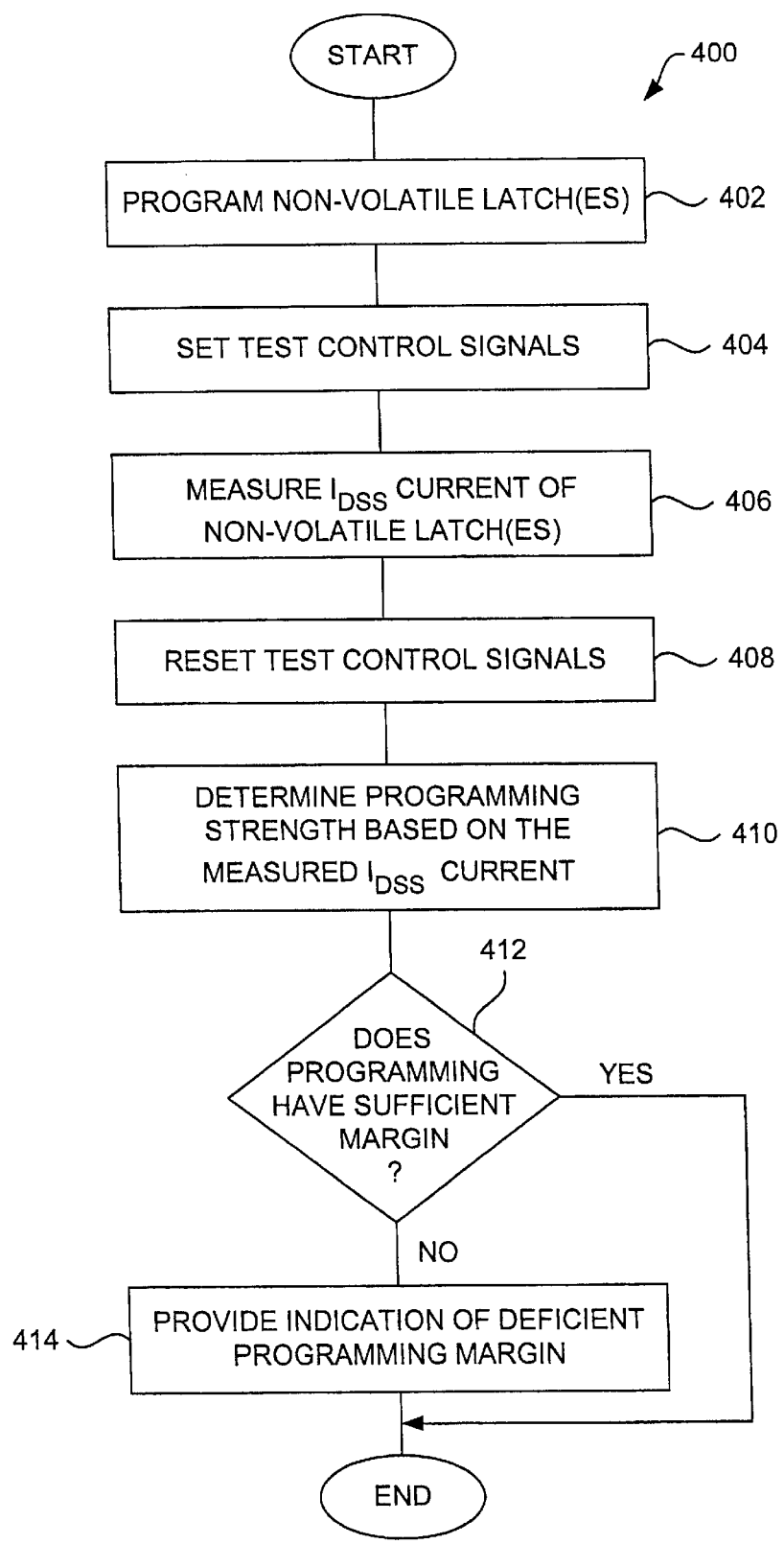
FIG. 4 is a flow diagram of latch program strength monitoring according to one embodiment of the invention.

Typically, the non-volatile memory circuit 300 is formed within an integrated circuit along with various other function circuitry. The test control lines (TCL) would normally be accessible external to the integrated circuit (e.g., via pins on the integrated circuit). FIG. 4 is a flow diagram of latch program strength monitoring 400 according to one embodiment of the invention. The latch program strength monitoring 400 is, for example, performed using the non-volatile memory circuit 200 illustrated in FIG. 2 or the non-volatile memory circuit 300 illustrated in FIG. 3.

The latch program strength monitoring 400 initially programs 402 one or more non-volatile latches. Here, for ease of reference, it is assumed that only a single non-volatile latch is programmed 402. However, it should be recognized that multiple non-volatile latches are usually used together (see FIG. 5). The single non-volatile latch can, for example, be the non-volatile latch illustrated in FIG. 2 or FIG. 3.

Sometime after the non-volatile latch is programmed 402 it is desired to evaluate programming strength of the non-volatile latch. This point in time can be soon after programming or a significant amount of time after programming. For example, the evaluation could be during manufacture, use, or return of the non-volatile latch. In any case, when the programming strength is to be evaluated, test control signals are set 404 to implement the monitoring of the program strength of one of the two memory devices (the other memory device can be done next). Then, a drain-to-source-shorted ($1_{DSS}$) current of the non-volatile latch is measured 406. Once the drain-to-source-shorted ($1_{DSS}$) current is measured 406, the test control signals can be reset 408.

As an example, the non-volatile memory circuit 300 illustrated in FIG. 3 includes a non-volatile latch having two memory cell provided by the NMOS transistors 301 and 302. Each of the NMOS transistors 301 and 302 has a drain-to-source-shorted ($1_{DSS}$) current that can be measured in this manner. The drain-to-source-shorted ($1_{DSS}$) current for the NMOS transistor 301 can be measured by activating the first test PMOS transistor 324 via the second test control line (TCL-2) and reading the current from the first test control line (TCL-1). Similarly, the drain-to-source-shorted ($1_{DSS}$) current for the NMOS transistor 302 can be measured by activating the second test PMOS transistor 326 via the third test control line (TCL-3) and reading the current from the first test control line (TCL-1). Typically, only one of the first and second test PMOS transistors 324 and 326 is activated at a time.

After the drain-to-source-shorted ($1_{DSS}$) current has been measured 406, the programming strength is determined 410 based on the drain-to-source-shorted ($1_{DSS}$) current that has been measured. A decision 412 then determines whether the programming of the non-volatile latch has sufficient margin. Here, the sufficient margin provides an indication of the reliability of the non-volatile latch programming over an extended period of time. When the decision 412 determines that the programming does not have sufficient margin, then an indication of deficient programming margin can be provided 414. Here, an operator or system controller can be informed by a visual, audio or textural output that the non-volatile latch being tested has a deficient programming margin. At this point, the operator can take a remedial action with respect to the non-volatile latch such as reprogramming or discarding the non-volatile latch. On the other hand, when the decision 412 determines that the programming does have sufficient margin, then the operation 414 is bypassed. Following the operation 412 when the programming margin is sufficient as well as following the operation 414 when programming margin is not sufficient, the latch program strength monitoring 400 is complete and ends.

The latch program strength monitoring 400 can test multiple non-volatile latches at the same time. Their individual drain-to-source-shorted ($1_{DSS}$) currents can also be grouped (summed) and an evaluation made from the grouped drain-to-source-shorted current along with knowledge of the programmed states for the multiple non-volatile latches.

Figure 5:
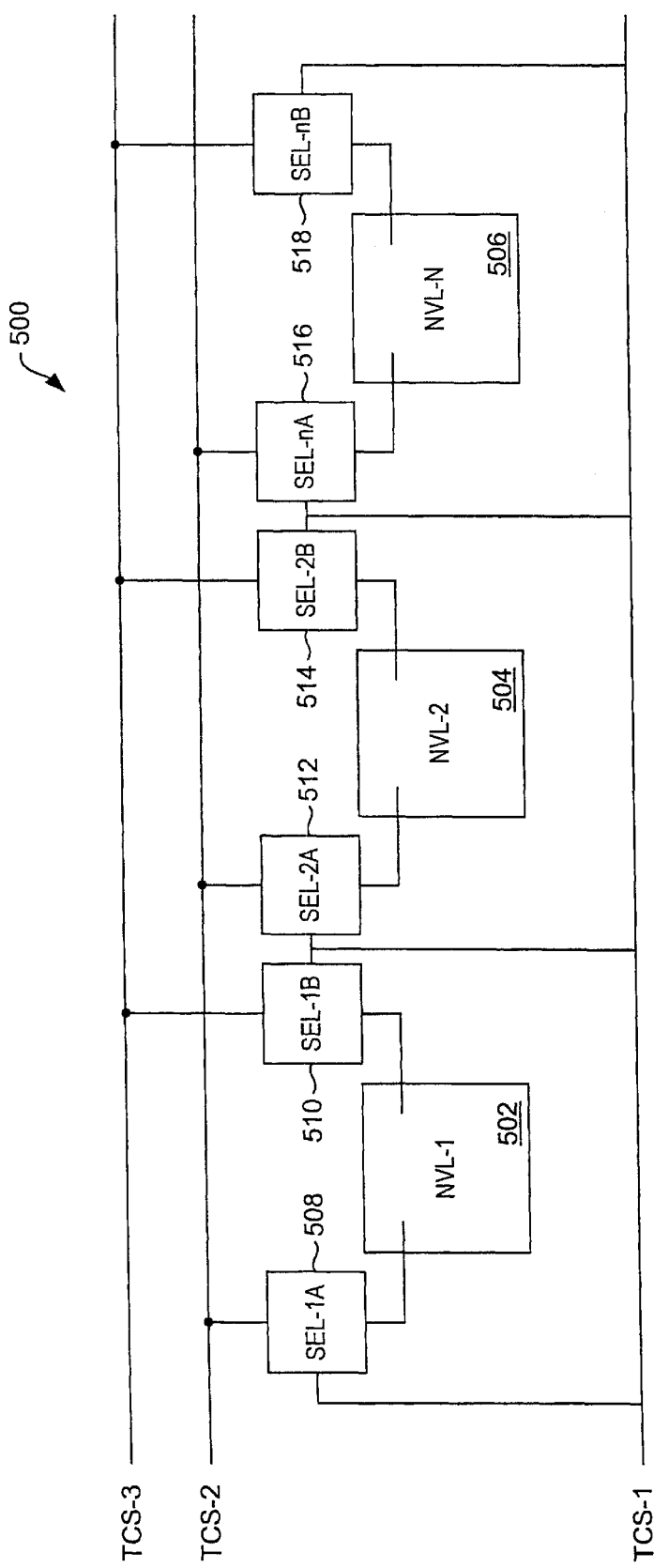
FIG. 5 is a block diagram of an integrated circuit according to one embodiment of the invention.

FIG. 5 is a block diagram of an integrated circuit 500 according to one embodiment of the invention. The integrated circuit 500 includes a plurality of non-volatile latches on the integrated circuit 500. Each of the non-volatile latches provides one-bit of data storage. In one embodiment, the integrated circuit 500 use a register to semi-permanently holds a digital value. The stored digital value can, for example, be used as user programmable switches.

As illustrated, the integrated circuit 500 includes a first non-volatile latch (NVL-1) 502, a second non-volatile latch (NVL-2) 504, and an $n^{th}$ non-volatile latch (NVL-n) 506, where n represents an integer greater than two. For each non-volatile latch 502, 504 and 506, the integrated circuit 500 includes a pair of select transistors so that internal currents within the non-volatile latches 502, 504 and 506 can be measured or monitored for purposes of evaluating program strength of the respective non-volatile latches 502, 504 and 506. In particular, the integrated circuit 500 includes a test selector (SEL-1A) 508 and a test selector (SEL-1B) 510 associated with the first non-volatile latch (NVL-1) 502; a test selector (SEL-2A) 512 and a test selector (SEL-2B) 514 associated with the second non-volatile latch (NVL-2) 504; and a test selector (SEL-nA) 516 and a test selector (SEL-nB) 518 associated with the $n^{th}$ non-volatile latch (NVL-n) 506. Typically, for each non-volatile latch 502, 504 and 506, one of the associated pairs of test selectors is activated to measure an internal current (e.g., $1_{DSS}$) associated with a memory cell within the respective non-volatile latch. This internal current is supplied external to the integrated circuit 500 through a first test control signal TCS-1). The test selectors 508-518 are activated by either a second test control signal (TCS-2) or a third test control signal (TCS-3). The test selectors 508, 512 and 516 are illustrated as being activated by the second test control signal (TCS-2) and to the test selectors 510, 514 and 518 are illustrated as being activated by the third test control signal (TCS-3).

Note that in FIG. 5, the first test control signal (TSC-1) is supplied to each of the test selectors 508-518. Hence, the resulting current appearing on the first test control signal (TSC-1) can be a cumulative current. However, by providing additional test lines or using multiplexing for selective activation, individualized currents can be measured. By sharing the test control signals (TCS-1, TCS-2, and TCS-3) test related lines can be kept to a minimum. The combination of the measured shared $1_{DSS}$ currents and the knowledge of the digital contents of the non-volatile latches 502, 504 and 506 allows the strength of the non-volatile latches 502, 504 and 506 to be determined.

Typically, the integrated circuit 500 would be placed in a test mode when the test control signals are to be used to monitor program strength.

The non-volatile latches discussed above output a digital value via a buffer (e.g., an inverter). Hence, in the above embodiments, the non-volatile latches are not provided in a large matrix, and thus the non-volatile latches or memory circuits do not require row or column selection circuitry and sense amplifier circuitry.

The advantages of the invention are numerous. Different embodiments or implementations may yield one or more of the following advantages. One advantage of the invention is that programming margin can be conveniently examined. Another advantage of the invention is that program strength can be determined based on a quantitative examination of program charge. Yet another advantage of the invention is that reliability or failure testing of non-volatile latches is facilitated. Such testing can, for example, allow for rejection of defective non-volatile latches, determining end of programming life or program strength over time, or determining need for refresh programming.

The many features and advantages of the present invention are apparent from the written description and, thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A non-volatile memory circuit, comprising:
    a first floating gate transistor having a drain terminal, a source terminal, a control gate terminal, and a charge injection terminal, the drain terminal being coupled to a first node, the source terminal being coupled to a first potential, the gate terminal being coupled to a first set potential, and the charge injection terminal being coupled to a second set potential;
    a second floating gate transistor having a drain terminal, a source terminal, a control gate terminal, and a charge injection terminal, the drain terminal being coupled to a second node, the source terminal being coupled to the first potential, the gate terminal being coupled to the second set potential, the charge injection terminal being coupled to the first set potential;
    a first latch transistor having a drain terminal, a source terminal and a gate terminal, the drain terminal being coupled to the first node, the source terminal being coupled to a second potential, and the gate terminal being coupled to the second node;
    a second latch transistor having a drain terminal, a source terminal and a gate terminal, the drain terminal being coupled to the first node, the source terminal being coupled to the second potential, and the gate terminal being coupled to the first node;
    a first test transistor having a drain terminal, a source terminal and a gate terminal, the drain terminal being coupled to the first node, the source terminal being coupled to a first test line, and the gate terminal being coupled to a second test line;
    a second test transistor having a drain terminal, a source terminal and a gate terminal, the drain terminal being coupled to the second node, the source terminal being coupled to the first test line, and the gate terminal being coupled to a third test line; and
    an output buffer coupled to the second node for providing an output of said non-volatile memory circuit.

2. A non-volatile memory circuit as recited in claim 1, wherein said first and second floating gate transistors are NMOS devices, and wherein said first and second latch transistors are PMOS devices.

3. A non-volatile memory circuit as recited in claim 2, wherein said first and second test transistors are PMOS devices.

4. A non-volatile memory circuit as recited in claim 3, wherein said output buffer is an inverter.

5. A non-volatile memory circuit as recited in claim 1, wherein the output for said non-volatile memory circuit provided by said output buffer is obtained without row and column selection devices.

6. A non-volatile memory circuit as recited in claim 1, wherein said non-volatile memory circuit is provided in an integrated circuit.

7. A non-volatile memory circuit as recited in claim 1, wherein said non-volatile memory circuit is an Electrically Erasable Programmable Read-Only Memory (EEPROM).

8. An integrated circuit, comprising:
    is a first non-volatile latch providing a pair of first memory cells that together provide a first bit of memory;
    a first pair of test selectors respectively controllably coupled to the pair of said first memory cells;
    a second non-volatile latch providing a pair of second memory cells that together provide a second bit of memory;
    a second pair of test selectors respectively controllably coupled to the pair of said second memory cells;
    a third non-volatile latch providing a pair of third memory cells that together provide a third bit of memory;
    a third pair of test selectors respectively controllably coupled to the pair of said first memory cells;
    a first test line operatively connected to said first pair of test transistors;
    a second test line operatively connected to one of the test selectors of said first pair of transistors; and
    a third test line operatively connected to another of the test selectors of said first pair of transistors.

9. An integrated circuit as recited in claim 8, wherein, when at least one of said second test line and said third test line is activated, said first test line carries an indication of program strength for said first non-volatile latch.

10. An integrated circuit as recited in claim 8,
    wherein said first test line operatively connects to said first pair of test transistors, said second pair of test transistors, and said third pair of test transistors,
    wherein said second test line operatively connects to one of the test selectors of said first pair of transistors, said second pair of transistors, and said third pair of transistors; and
    wherein said third test line operatively operatively connects to another of the test selectors of said first pair of transistors, said second pair of transistors, and said third pair of transistors.

11. An integrated circuit as recited in claim 10, wherein, when at least one of said second test line and said third test line is activated, said first test line carries an indication of program strength for said first non-volatile latch, said second non-volatile latch, and a third non-volatile latch.

12. An integrated circuit as recited in claim 11, wherein the indication of program strength is a cumulative program strength for said first non-volatile latch, said second non-volatile latch, and a third non-volatile latch.

* * * * *